June 8, 1965 L. W. BALLARD 3,188,496
TRANSISTOR FREQUENCY MULTIPLIER EMPLOYING DIODE PROTECTED TRANSISTOR AND TUNED CIRCUIT
Filed April 15, 1963
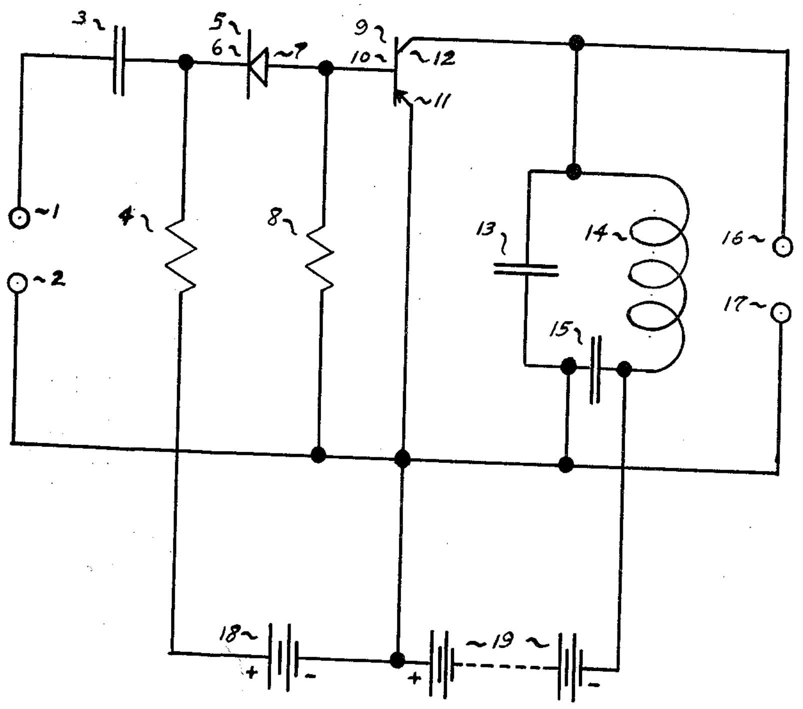
Lyttleton W. Ballard,
INVENTOR.

United States Patent Office 3,188,496
Patented June 8, 1965

3,188,496
TRANSISTOR FREQUENCY MULTIPLIER EMPLOYING DIODE PROTECTED TRANSISTOR AND TUNED CIRCUIT

Lyttleton W. Ballard, 2217 Wake Forest St., Virginia Beach, Va.

Filed Apr. 15, 1963, Ser. No. 273,196
5 Claims. (Cl. 307—88.5)

In a typical vacuum tube frequency multiplier circuit it is well established from both theoretical and experimental considerations that the power which can be developed in the output signal can be enhanced if the grid bias of the multiplier tube is set at a discrete value below the cut-off point; and the level of the input signal then chosen so that the tube is driven into conduction during only a predetermined fraction of each cycle of said input signal, said predetermined fraction usually being less than one half. It is also well established that a signal of relatively large amplitude is desirable for the input to a vacuum tube frequency multiplier in order to realize a relatively steep slope in that portion of the input signal selected for conduction.

Under such conditions the grid of the tube in a frequency multiplier is driven to a comparatively large voltage with respect to the tube's cathode during that portion of each cycle of the input signal in which the tube is in the non-conducting condition. In most vacuum tube circuits such comparatively large voltages between grid and cathode are of little consequence since the maximum voltages for which tubes are designed are seldom approached. In transistor circuitry, however, large values of base-to-emitter cut-off bias and large amplitudes of input signals cannot so readily be applied due to the relatively small voltage which can be tolerated between the base and emitter of many transistors without causing damage and/or unwanted conduction. It is an object of this invention to provide a transistor frequency multiplier capable of accepting input signals of relatively large amplitude with neither damage to nor undesirable conduction by the transistor resulting from said signals. It is a further object of this invention to provide a transistor frequency multiplier to which an input signal of large amplitude can be applied and made to bring the transistor into its conducting state during only a small fraction of each cycle of said input signal.

The drawing shows a transistor frequency multiplier circuit of common emitter configuration. An input signal, often of sinusoidal characteristics, is impressed between input terminals 1 and 2 of the device. Capacitor 3 permits passage of said input signal while removing any D.C. components which may originate in the source thereof. Semiconductor diode 5 is assembled with its anode 7 maintained at the D.C. potential of emitter 11 of PNP transistor 9 by means of an impedance 8 such as a resistor, said impedance 8 being of a value suitable to permit passage of alternating signals from semiconductor 5 to base 10 of transistor 9 without significant shunting effect. Cathode 6 of semiconductor 5 is biased by means of a source of potential 18 and impedance 4 such as a resistor to a predetermined potential with respect to anode 7 of said semiconductor 5, said impedance 4 being of a value suitable to permit passage of alternating signals from capacitor 3 to semiconductor 5 without significant shunting effect. Both the level of the bias on cathode 6 of semiconductor 5 and the amplitude of the signal impressed between terminals 1 and 2 are selected to provide Class C operation. Thus, base 10 of transistor 9 conducts during only a portion of each cycle of said input signal corresponding to the desired conduction angle. Furthermore, it is immediately apparent that the amplitude of said input signal can be made appreciably large without in any way jeopardizing the proper operation of transistor 9, because of the blocking action of diode 5 when cathode 6 becomes positive with respect to emitter 11. In this manner damage to said transistor 9 from reverse conduction caused by excessive base-to-emitter voltage is prevented.

During that portion of each cycle of the input signal during which base 10 of transistor 9 conducts, collector 12 of said transistor 9 also conducts; and energy is thereby supplied to the resonant circuit containing capacitor 13 and inductance 14, said resonant circuit being tuned to an exact multiple of the frequency of the signal fed into input terminals 1 and 2. The output signal is drawn from the device through terminals 16 and 17. Source of potential 19 provides the primary power from which the output current is derived. Capacitor 15 provides a low impedance path for alternating currents, said low impedance path being in shunt with said source of potential 19.

I claim:

1. A Class C frequency multiplier comprising:
a transistor having a control junction and an output element;
electrical power source means;
circuitry coupling said source means with said transistor for operating the latter in the Class C mode, and including means for applying an input signal to said junction and means preventing substantial reverse biasing of said junction during nonconduction of the transistor; and
a resonant circuit coupled with said output element and tuned to a multiple of the frequency of said input signal.

2. A Class C frequency multiplier comprising:
a transistor having an input element, an output element, and a comon element forming a control junction with said input element;
electrical power source means;
circuitry coupling said source means with said elements for operating said transistor in the Class C mode, and including means for applying an input signal to said input element, and means coupled with said input element and preventing substantial reverse biasing of said junction during non-conduction of the transistor; and
a resonant circuit coupled with said output element and tuned to a multiple of the frequency of said input signal.

3. The invention of claim 2, wherein said reverse bias preventing means comprises a unidirectional current conducting device coupled in series between said input element and said input signal applying means.

4. A Class C frequency multiplier comprising:
a transistor having an input element, an output element, and a common element forming a control junction with said input element;
electrical power source means;
circuitry coupling said source means with said elements for operating said transistor in the Class C mode, and including a first impedance coupled in shunt relationship to said control junction, a unidirectional current conducting device having a cathode terminal and an anode terminal, means coupling one of said terminals with said input element, a second impedance coupling the other of said terminals with said source means, and means for applying an input signal to said other terminal, said device having its terminals arranged to permit substantial conduction therebetween only when said input signal is of sufficient magnitude to forward bias said junction; and
a resonant circuit coupled with said output element and tuned to a multiple of the frequency of said input signal.

5. The invention of claim 4, wherein said second impedance has a sufficiently large ohmic value to present a relatively high impedance path to said input signal as compared with the path through said device and said junction, whereby to prevent substantial shunting of said input signal to the source means during transistor conduction.

References Cited by the Examiner

UNITED STATES PATENTS

| | | | |
|---|---|---|---|
| 3,044,004 | 7/62 | Sicard | 328—20 X |
| 3,132,303 | 5/64 | Rall | 307—88.5 |

ARTHUR GAUSS, *Primary Examiner.*